US006627945B1

(12) United States Patent
Tripsas et al.

(10) Patent No.: US 6,627,945 B1
(45) Date of Patent: Sep. 30, 2003

(54) MEMORY DEVICE AND METHOD OF MAKING

(75) Inventors: Nicholas H. Tripsas, San Jose, CA (US); Mark T. Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/189,651

(22) Filed: Jul. 3, 2002

(51) Int. Cl.[7] .............................................. H01L 29/788
(52) U.S. Cl. ....................................... 257/315; 257/314
(58) Field of Search ................................ 257/314–316, 257/321

(56) References Cited

U.S. PATENT DOCUMENTS

| | | | |
|---|---|---|---|
| 4,794,565 A | * 12/1988 | Wu et al. | 365/185.15 |
| 5,742,075 A | * 4/1998 | Burns et al. | 257/59 |
| 5,923,063 A | * 7/1999 | Liu et al. | 257/316 |
| 6,501,123 B2 | * 12/2002 | Liu | 257/315 |
| 2002/0130357 A1 | * 9/2002 | Hurley et al. | 257/321 |

FOREIGN PATENT DOCUMENTS

JP           63252482 A    * 10/1988           H01L/29/78

* cited by examiner

Primary Examiner—Allan R. Wilson
(74) Attorney, Agent, or Firm—Renner, Otto, Boisselle & Sklar, LLP

(57) ABSTRACT

A non-volatile memory device includes a number of memory cells, parts of which are delineated by insulators. The insulators each include both a lower trench-fill insulator portion in a trench in the substrate, and an upper protruding portion that protrudes from the substrate. Between each pair of adjacent protruding insulator portions there is a pair of floating gates, the floating gates in contact with respective of the protruding insulator portions. There is a space or gap between the floating gates, such that a portion of a control gate enters therein, separated from the substrate by only an interpoly dielectric such as an oxide-nitride-oxide (ONO) stack, and a tunnel oxide. By storing charge on the floating gates, the conductivity of a channel between the floating gates may be altered. For example, conductivity through the channel may be "pinched off" by storing charge on the floating gates.

22 Claims, 4 Drawing Sheets

MEMORY DEVICE AND METHOD OF MAKING

BACKGROUND OF THE INVENTION

1. Field of Invention

The present invention relates to non-volatile memory devices, and methods for making such devices.

2. Description of the Related Art

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells or a sector of cells in the device at once.

As with many types of semiconductor devices, requirements for increases in device density to increase speed of operation for integrated circuit devices and/or to reduce their cost, have led to a desire for decreased size of individual components of non-volatile memory devices, such as cells of memory devices.

SUMMARY OF THE INVENTION

According to an aspect of the invention, a non-volatile memory device includes a semiconductor substrate, wherein the substrate has a pair of trenches therein, and wherein the substrate has a source and a drain therein; a tunnel oxide on a top substrate surface of the substrate; a pair of insulators; a pair of floating gates over the tunnel oxide and between the insulators, wherein the floating gates are each operatively coupled to the source and the drain, and wherein the floating gates have a gap therebetween; an interpoly dielectric over the floating gate, wherein the interpoly dielectric is in contact with the floating gate; and a control gate over the interpoly dielectric, wherein the control gate is in contact with the interpoly dielectric. A channel gate portion of the control gate is located in the gap between the floating gates.

According to another aspect of the invention, a non-volatile memory device includes a semiconductor substrate, wherein the substrate has a pair of trenches therein, and wherein the substrate has a source and a drain therein; a tunnel oxide on a top substrate surface of the substrate; a pair of insulators; a pair of floating gates over the tunnel oxide and between the insulators, wherein the floating gates are each operatively coupled to the source and the drain, and wherein the floating gates have a gap therebetween; an interpoly dielectric over the floating gate, wherein the interpoly dielectric is in contact with the floating gate; and a control gate over the interpoly dielectric, wherein the control gate is in contact with the interpoly dielectric. A channel gate portion of the control gate is located in the gap between the floating gates. The insulators have respective lower trench-fill portions in respective of the trenches, wherein the insulators have respective upper protruding portions protruding from the top substrate surface. The upper protruding portions have respective top insulator surfaces. The floating gates are in contact with respective of the upper protruding portions of the insulators. The control gate is configured such that a channel in the substrate, underneath the channel gate portion of the control gate, becomes conductive when 1) there is no charge stored on the floating gates, and 2) a sufficiently high threshold voltage is provided on the control gate. The floating gates are configured such that, when a sufficient charge is stored on the floating gates, the threshold voltage is increased to an increased threshold voltage.

According to a further aspect of the invention, a method of making a non-volatile memory device includes: forming a pair of insulators on a substrate, the insulators each having an upper protruding portion that protrudes from a top substrate surface of the substrate; forming a pair of floating gates between the upper protruding portions, wherein the floating gates are in contact with respective of the upper protruding portions, and wherein the floating gates have a gap therebetween; forming an interpoly dielectric on the floating gates and the upper protruding portions; and forming a control gate on the interpoly dielectric, wherein a channel gate portion is in the gap between the floating gates.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale.

DETAILED DESCRIPTION

A non-volatile memory device includes a number of memory cells, parts of which are delineated by insulators. The insulators each include both a lower trench-fill insulator portion in a trench in the substrate, and an upper protruding portion that protrudes from the substrate. Between each pair of adjacent protruding insulator portions there is a pair of floating gates, the floating gates in contact with respective of the protruding insulator portions. There is a space or gap between the floating gates, such that a portion of a control gate enters therein, separated from the substrate by only an interpoly dielectric such as an oxide-nitride-oxide (ONO) stack, and a tunnel oxide. By storing charge on the floating gates, the conductivity of a channel between the floating gates may be altered. For example, conductivity through the channel may be "pinched off" by storing charge on the floating gates. In other words, each of the gates may separately control the threshold voltage in the channel. Thus information may be stored by altering the charge on the floating gates. By suitably linking together a number of memory cells, and measuring changes in transistor characteristics, memory devices may be produced having NAND or NOR architectures.

In the following description, first the device structure is described for a memory device in accordance with the present invention. Then discussion is made of a range of high-K materials which may be used in the memory device. Finally, a method of fabricating the device is described.

Device Structure

Figure 1:
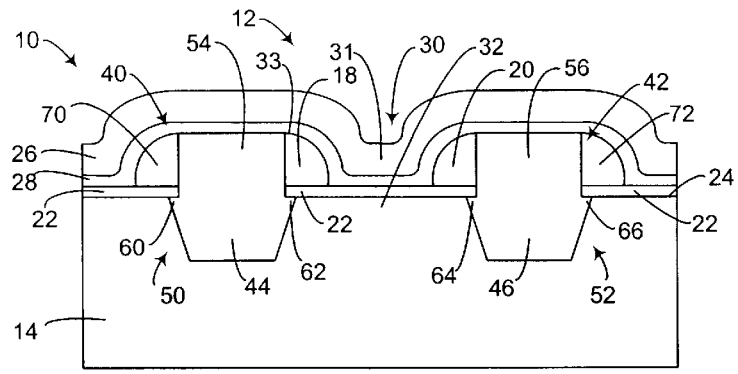
FIG. 1 is a side cross-sectional schematic view of a non-volatile memory device formed in accordance with the present invention.
Figure 2:
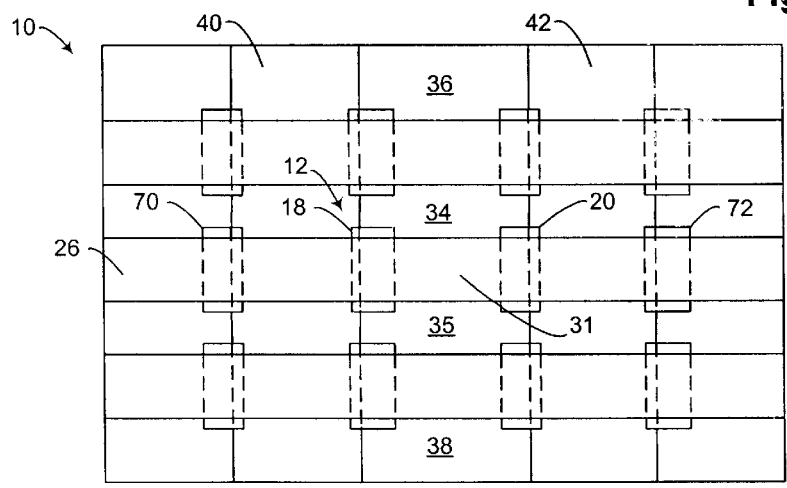
FIG. 2 is a top view of the memory device of FIG. 1.

Turning initially to FIGS. 1 and 2, a non-volatile memory device 10 includes a number of memory cells, such as the cell 12, on a substrate 14. The substrate 14 may be silicon substrate, or may be another sort of semiconductor material. The cell 12 includes a floating gates 18 and 20, with a tunnel oxide 22 between the floating gates 18 and 20 and a top substrate surface 24 of the substrate 14. A control gate 26 overlies the floating gates 18 and 20, as well as the floating gates of several other cells. An interpoly dielectric 28 is between the control gate 26 and the floating gates 18 and 20.

The floating gates 18 and 20 have a gap 30 therebetween, into which a channel gate portion 31 of the control gate 26 enters. The channel gate portion 31 is operatively coupled to a channel 32 of the substrate 14, which is underneath the channel gate portion 31. It will be appreciated that the channel gate portion 31 of the control gate 26 is configured such that, under the proper conditions, application of a voltage (potential) to the control gate 26 allows the channel 32 to become conductive, thereby allowing conduction of electricity through the channel 32.

As shown in FIG. 1, the floating gates may have curved upper surfaces, such as the curved upper surface 33 of the floating gate 18.

Figure 3:
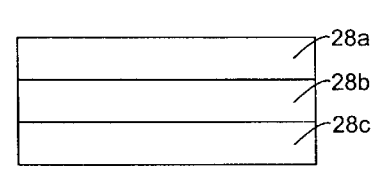
FIG. 3 is a cross-sectional schematic view showing detail of the interpoly dielectric of FIGS. 1 and 2.

As explained in greater detail below, the interpoly dielectric 28 may by a traditional oxide-nitride-oxide (ONO) layer having two oxide layers sandwiching a nitride layer, or may include a high-K dielectric material. Thus, as shown in FIG. 3, the dielectric material 28 includes a top dielectric layer 28a, a middle dielectric layer 28b, and a bottom dielectric layer 28c. The top dielectric layer 28a and the bottom dielectric layer 28c may be oxide layers, for example silicon dioxide. The middle dielectric layer 28b may include a nitride, such as silicon nitride. The middle dielectric layer 28b may also include a high-K dielectric material, replacing the nitride in whole or in part.

Doped portions, for example a source 34 and a drain 35, are formed in the substrate 14. The source 34 and the drain 35 are operatively coupled to the floating gates 18 and 20, in order to provide an electrical charge to the floating gates 18 and 20 when a sufficient potential difference is applied between the source 34 and the drain 35. The electric charge causes the transistor of the cell 12 to act like an electron gun, trapping electrons within the floating gate 20, which changes a threshold voltage of the cell 12. Program or erase may also be achieved using Fowler-Nordheim tunneling.

In addition, conduction can occur from the source 34 to the drain 35 through the channel 32 of the substrate 14, when the control gate 26 is at a sufficiently high voltage such that the semiconductor material of the channel 32 is rendered conductive, and when conductivity through the channel is not pinched by placing a sufficient charge on the floating gates 18 and 20. As seen in FIG. 2, the sources and drains of different cells may be configured so that, for example, the drain for one of the cells also functions as a source for an adjacent cell. Thus the cells may be linked such that pinching of any of the channels of a plurality of cells so linked together, may be detected by a single measurement. For example, a potential difference may be applied across a pair of doped portions 36 and 38 of the substrate 14, the doped portions 36 and 38 spanning several linked cells of the device 10. The current flowing between the doped portions 36 and 38 provides a measure of whether any of the intervening cells have pinched channels (channels where the charge on the floating gates has raised the threshold voltage of the transistor). Alternatively, the measured current flow may be an indication of how many intervening memory cells have their channels pinched, and therefore how many of the intervening cells have a charge on their floating gates sufficient to pinch their corresponding channels.

It will be appreciated that "pinching" a channel, as used herein, may include situations where placing a charge on the floating gates does not fully preclude making the corresponding channel conductive, but may only increase the threshold voltage of the control gate to render the channel conductive. Situations where the pinching of the channel fully precludes making the channel conductive may be considered as making the threshold voltage very large, for practical purposes infinite.

FIG. 2, shows the memory cells of the device 10 arranged in a NAND configuration. It will be appreciated that other arrangements of memory cells may be made to produce other types of memory devices, for example NOR memory devices.

As noted above, the substrate 14 may be a semiconductor material, such as silicon. It will be appreciated that there are a wise range of alternative substrate materials and/or configurations, including other semiconductor materials, semiconductor-on-insulator (SOI) substrates, and semiconductor-on-sapphire (SOS) substrates. The source 34 and the drain 35 may be suitably doped regions of the substrate 14. The tunnel oxide 22 may be silicon dioxide grown on the top substrate surface 24 of the substrate 14. The floating gates 18 and 20 may be polysilicon, and may be doped with a suitable material, such as phosphorous.

Insulators 40 and 42 are on opposite sides of the cell 12, and provide insulation between the cell 12 and other cells of the memory device 10. The insulators 40 and 42 include respective lower trench-fill insulator portions 44 and 46, which are below the top substrate surface 24 of the substrate 14, in respective trenches 50 and 52 in the substrate 14. The insulators 40 and 42 also include respective upper protruding portions 54 and 56, which protrude from the substrate 14 above the tunnel oxide 22.

As shown in FIG. 1, the trenches 50 and 52 may have trapezoidal cross-sectional shapes, and the lower trench-fill insulator portions 44 and 46 may have corresponding cross-sectional shapes. The lower trench-fill insulator portions 44 and 46 may have respective pairs of corner parts 60, 62 and 64, 66, adjacent to the top substrate surface 24 of the substrate 14. The corner parts 60-66 may underlie the floating gates, with the corner parts 62 and 64 for example underlying the floating gates 18 and 20, respectively. It will appreciated that the trapezoidal shape may have rounded corners.

The upper protruding insulator portions 54 and 56 provide insulation between the floating gate 18 and 20 and adjacent floating gates 70 and 72, respectively, thus isolating the floating gates 18 and 20 from the floating gates 70 and 72.

The upper protruding insulator portions 54 and 56 may protrude from the top substrate surface 24 from about 1000 angstroms to about 4000 angstroms. The insulators 40 and 42 may include silicon oxide or another suitable insulator material that is compatible with the material of the substrate 14.

Figure 1A:
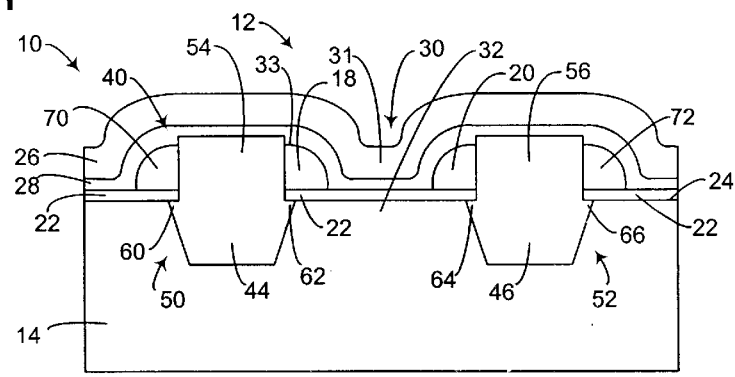
FIG. 1A is a side cross-sectional schematic view of an alternate embodiment non-volatile memory device formed in accordance with the present invention.

The floating gates 18 and 20 may have a height from the tunnel oxide 22 from about 1000 angstroms to about 3000 angstroms. Thus the floating gates 18 and 20 may have approximately the same height as the upper protruding insulator portions 54 and 56. Alternatively, the floating gates 18 and 20 may have a lower overall height than the upper protruding insulator portions 54 and 56. as shown in FIG. 1A.

The memory device 10 described above offers several potential advantages over prior memory cell devices. The use of the upper protruding insulator portions 54 and 56 may offer more reliable insulation between memory cells of the device, when compared with interpoly dielectric fences used in some prior devices. The interpoly dielectric fences may be difficult to remove in processing to form the finished device. Also, dielectric sidewalls may be difficult to consistently form, since it may be difficult to form vertical dielectric layers with suitable thickness while maintaining a reasonable thickness for corresponding horizontal layers.

In addition, the configuration described, with pinching of channels used as the mechanism for determining whether charge has been stored on the floating gates, may allow for increased accuracy of measurements, and/or for measurement with reduced energy. Further, the configuration described above may be particularly advantageous for use in reduced-side memory devices. The floating gates 18, 20, 70, and 72 are self-aligned to the insulators 40 and 42, which reduces the number of mask-and-etch operations to be performed, and thus provides improved tolerances. In connection, it may be advantageous to utilize high-K dielectrics in the interpoly dielectric 28, since such an interpoly dielectric may be thicker than a standard ONO dielectric with similar properties. Thus an interpoly dielectric with a high-K dielectric may be used in smaller devices, where the layers of a standard ONO dielectric may be too thin to be practical.

The non-volatile memory 10 shown in FIGS. 1 and 2 and described above includes a plurality of memory cells such as the memory cell 12. The memory 10 may include a plurality of word lines and bit lines. For example, the memory 10 may include a plurality of control gates, each operatively coupled to a plurality of floating gates.

High-K Dielectrics

As discussed above, the device shown in FIGS. 1 and 2 may advantageously utilize high-K material in the interpoly dielectric 28. The high-K material may replace all or a part of the nitride layer of the ONO layer. Various types of high-K materials are discussed below.

As used herein, the term "standard-K dielectric material" refers to a dielectric material having a dielectric constant K up to about 10. Such standard-K dielectric materials include, for example, silicon dioxide. which has a K of about 4, silicon oxynitride, which has a K of about 4–8 depending on the relative content of oxygen and nitrogen, and silicon nitride, which has a K of about 6–9, and aluminum oxide, which has a K of about 10.

As used herein, the term "mid-K dielectric material" refers to a dielectric material having a K in the range from greater than 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric material" refers to a dielectric material having a K of about 20 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more.

As used herein, the term "composite dielectric material" refers to a dielectric material comprising the elements of at least two other dielectric materials. A composite dielectric material may have a K value of a standard-K, mid-K or high-K dielectric material, depending on the elements combined to form the composite dielectric material. As described in more detail below, a composite dielectric material may be formed by co-deposition of its component elements, or by sequential deposition followed by a treatment step, e.g., thermal treatment, to combine the elements to form the composite dielectric material.

Regarding dielectric constants, or K values, silicon dioxide (sometimes simply referred to as "oxide") has a K value of about 4, while other dielectric materials have higher K values. Silicon nitride ("nitride"), for example, has a K of about 6 to 9 (depending on formation conditions). Much higher K values of, for example, 20 or more can be obtained with various transition metal oxides including hafnium oxide ($HfO_2$), zirconium oxide, ($Zro_2$), tantalum oxide ($Ta_{2O5}$), barium strontium titanate ("BST"), lead zirconate titanate ("PZT"), and others, some of which are described more fully below. Using a high-K dielectric material for full or partial replacement of the nitride layer to form a modified ONO structure would allow a low electrical thickness to be achieved even with a physically thick layer. For example, a layer of high-K dielectric material with a K of 20 and a thickness of 100 angstroms is substantially electrically equivalent to a layer of silicon dioxide (K about 4) having a thickness of about 20 angstroms. The electrically equivalent thickness of high-K materials may be referred to in terms of the equivalent oxide thickness. Thus, a layer of high-K dielectric material having a K of 20 and a given physical thickness has an equivalent oxide thickness (based on silicon dioxide) which is approximately ⅕ the given physical thickness. For even higher-K dielectric materials, even thicker gate dielectric layers can be formed while maintaining equivalent oxide thickness values lower than are possible with very thin silicon dioxide layers. In this way, the reliability problems associated with very thin dielectric layers may be avoided while transistor performance is increased. Thus, materials with high K values can be used for the ONO structure in flash memory devices for scaling down the electrical thickness of the ONO structure.

Approximate K-values or, in some cases, a range of K-values, are shown below in Table 1 for several exemplary dielectric materials. It is understood that the present invention is not limited to the specific dielectric materials disclosed herein, but may include any appropriate standard-K, mid-K, high-K and composite dielectric materials which are known and are compatible with the remaining elements of the semiconductor device with which the dielectric materials are to be used.

TABLE 1

| Dielectric Material | Approx. Dielectric Constant (K) (Relative Permittivity) |
|---|---|
| silicon dioxide | 3.9 |
| silicon nitride | 6–9 |
| silicon oxynitride | 4–8 |
| aluminum oxide | 10 |
| zirconium silicate | 12 |
| hafnium silicate | 15 |

TABLE 1-continued

| Dielectric Material | Approx. Dielectric Constant (K) (Relative Permittivity) |
|---|---|
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—~200 |
| $PbTiO_3$ | ~20—~200 |
| $BaTiO_3$ | ~20—~200 |
| $SrTiO_3$ | ~20—~200 |
| $PbZrO_3$ | ~20—~200 |
| PST ($PbSc_xTa_{1-x}O_3$) | ~200—~3000 |
| PZN ($PbZn_xNb_{1-x}O_3$) | ~200—~5000 |
| PZT ($PbZr_xTi_{1-x}O_3$) | ~100—~1000 |
| PMN ($PbMg_xNb_{1-x}O_3$) | ~200—~5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

For the interpoly dielectric, the foregoing high-K dielectric materials may be used for replacing the nitride layer of a traditional ONO layer fully or partially. If the nitride layer is replaced fully by a high-K dielectric material, the high-K deposition process can be modified to incorporate a small amount of nitride into the high-K layer by either introducing NO or $N_2O$ gas during the deposition or by sequentially depositing high-K dielectric material sub-layers and nitride sub-layers. Thus, the high-K deposition process can be modified for forming a nitrided high-K layer which functions as a charge storage layer. The amount of nitrogen incorporated may range from about 0.1 wt % to about 20 wt % or more. If the nitride is formed by introducing NO or $N_2O$ gas during the deposition, the amount of nitride in the resulting nitride/high-K layer may be in a range from about 1 wt % to about 10 wt %. If the nitride is formed by sequentially depositing sub-layers of nitride and high-K dielectric material, the amount of nitride in the resulting nitride/high-K layer may be in a range from about 1 wt % to about 20 wt %. Although these ranges represent typical values, the amount of nitride in the nitride/high-K layer may be as high as desired, with the recognition that as the ratio of nitride to high-K material increases, the gains attributed to addition of the high-K material will be reduced. Similarly, the amount of nitride in the nitride/high-K layer may be reduced further as desired, with the recognition that reducing the amount of nitride to a too-low level may result in loss of charge storage ability of this layer on the modified ONO structure.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

Formation of the Device

FIGS. 4–11 show various steps of a method of formation of the memory cell 12 of the memory device 10. It will be understood that the steps illustrated and described below describe only one method of forming the memory device 10, and that numerous variations are possible.

Figure 4:
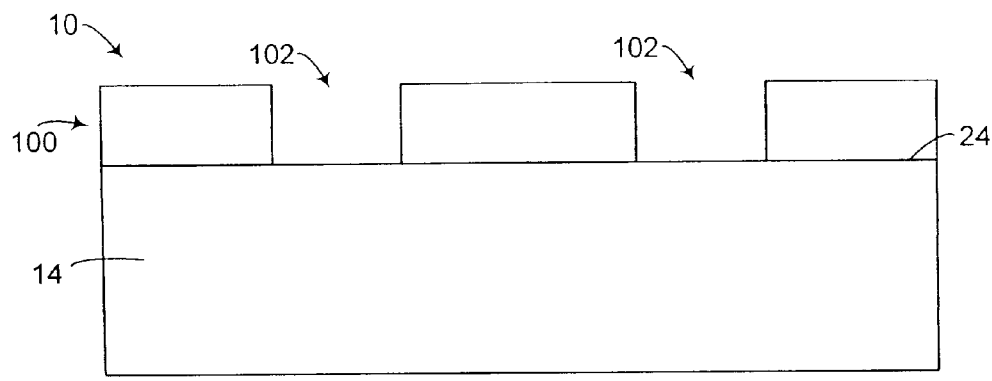
FIGS. 4–11 are side cross-sectional schematic views illustrating various steps in the manufacture of the device of FIGS. 1 and 2.

Turning now to FIG. 4, a mask 100 is formed on the top substrate surface 24 of the substrate 14. As described below, the mask 100 is utilized in the formation of the trenches 50 and 52, and in the formation of the insulators 40 and 42 which fill the trenches 50 and 52, and protrude from the substrate 14. The mask 100 may be made, for instance, by first covering the top substrate surface 24 with a layer of the mask material, for example silicon nitride. The nitride may be deposited by any of a variety of well-known deposition methods. The layer of mask material may then be coated with a layer of photoresist, such as by spin coating. The photoresist may then be selectively exposed to radiation such as light, through any of a variety of suitable methods. Exposed or unexposed photoresist is then removed (depending on the type of photoresist employed), and the exposed portions of the mask material are removed to produce gaps 102, exposing portions of the underlying substrate 14, thereby creating the mask 100. The selective removal of the photoresist may be accomplished, for example, by an acid wash using a suitable acid, and the removal of exposed portions of the mask material may be accomplished by a suitable etching process, for example wet etching or dry etching.

Figure 5:
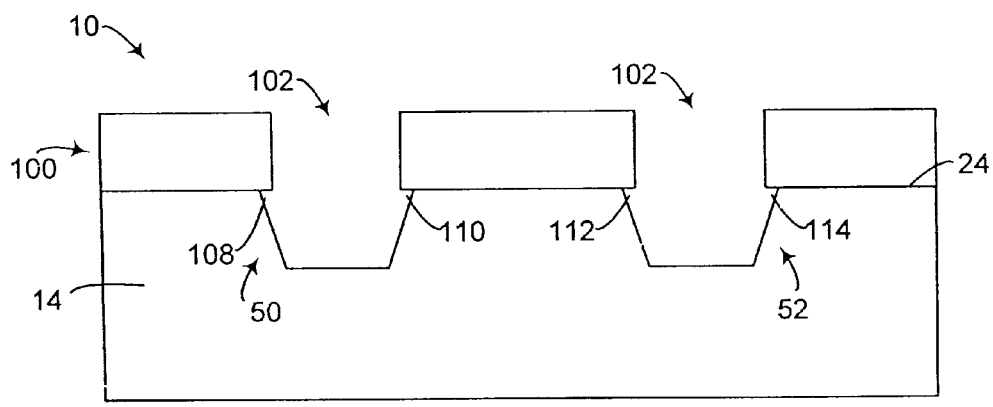

As shown in FIG. 5, the mask 100 is used as an etch mask for an etch of the substrate 14 to form the trenches 50 and 52. Following the etching, a liner oxidation is performed, thereby allowing the trenches 50 and 52 to undercut the mask 100 somewhat, for example at locations 108, 110, 112, and 114. It will be appreciated that other methods of etching may be utilized, since there are a variety of suitable known techniques for forming trenches for shallow trench isolation (STI). For example anisotropic etches such as plasma etching may be used. Such other methods may produce a different trench cross-sectional shape than is shown in FIG. 4.

Figure 6:
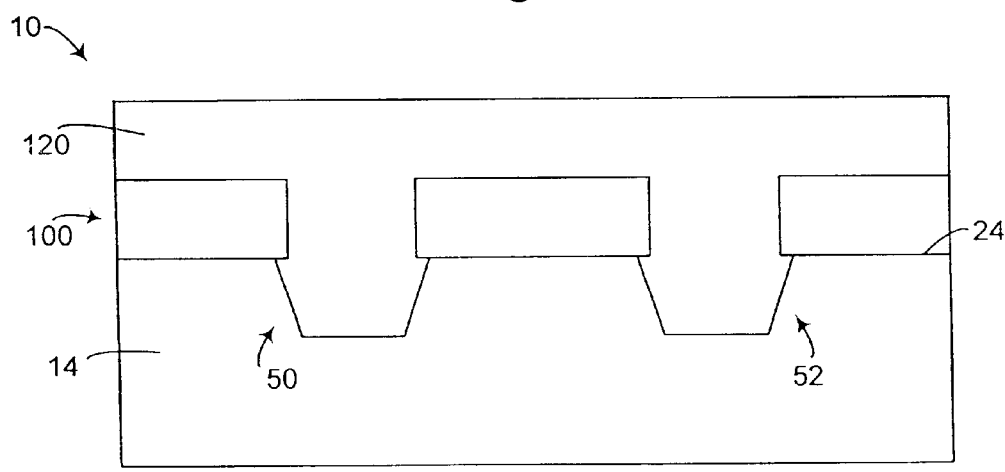

In FIG. 6, insulating material 120 is deposited, filling the trenches 50 and 52, filling the gaps between the elements of the mask 100, and overlying the mask 100. The insulating material may be any of a variety of materials, for example silicon oxide. The silicon dioxide may be formed, for example, by a chemical reaction involving $SiH_4$ or TEOS. The deposit of the insulating material 120 may be accomplished by conventional means, for example chemical vapor deposition (CVD) such as low pressure chemical vapor deposition (LPCVD), plasma enhanced chemical vapor deposition (PECVD), or high density plasma (HDP).

Figure 7:
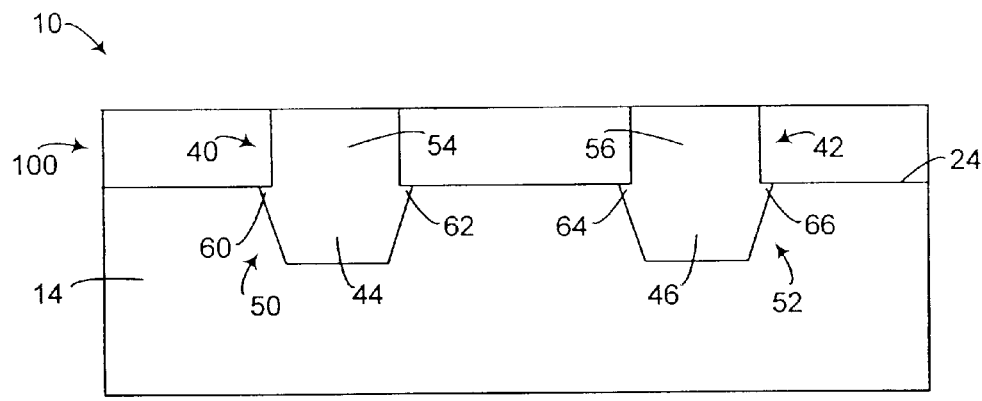

FIG. 7 shows the results of planarization of the insulating material 120, to form the insulators 40 and 42. The planarization may include polishing, such as chemical mechanical polishing (CMP). The elements of the mask 100 may be used as polish stops for the CMP. It will be appreciated that suitable alternatives may be employed for one or more of the above steps. For example, the mask 100 may be replaced or coated by a material suitable for use as a polish stop, prior to the deposition and planarization of the insulating material 120.

Figure 8:
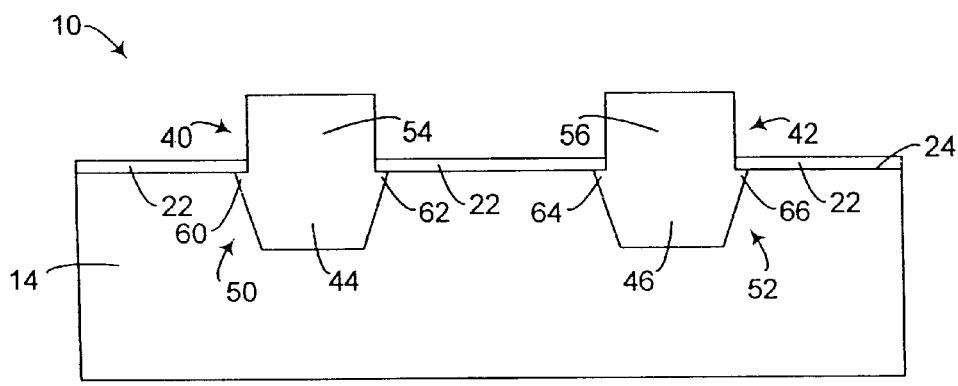

Turning now to FIG. 8, the mask 100 is removed, and the tunnel oxide 22 is grown on the top substrate surface 24 of the substrate 14. The tunnel oxide 22 may be formed by exposing the substrate 14 to a suitable oxygen-containing atmosphere, under suitable conditions. It will be appreciated that suitable preparatory steps may be taken, such as cleaning the top substrate surface 24 prior to the formation of the tunnel oxide 22.

Figure 9:
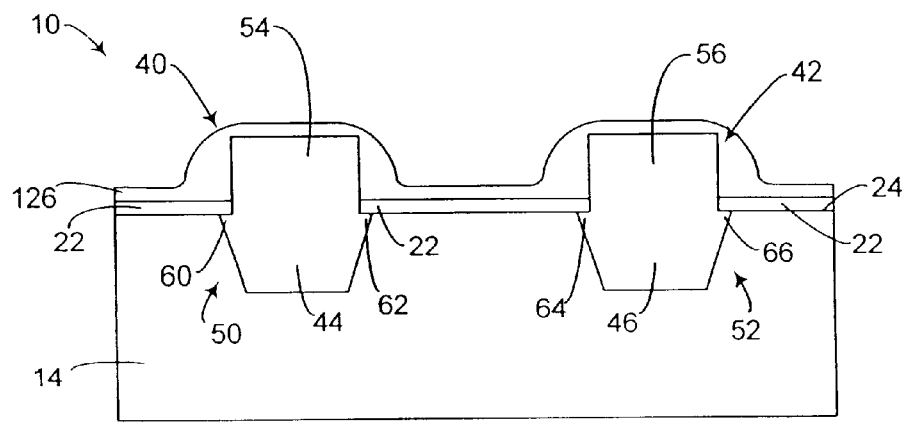

Semiconductor material 126 is then conformally deposited, as is shown in FIG. 9, for subsequent formation of the floating gates. As noted above, the semiconductor material 126 may be polysilicon doped in situ with phosphorous. The polysilicon may be deposited using conventional processes such as LPCVD or plasma enhanced chemical vapor deposition (PECVD).

Figure 10:
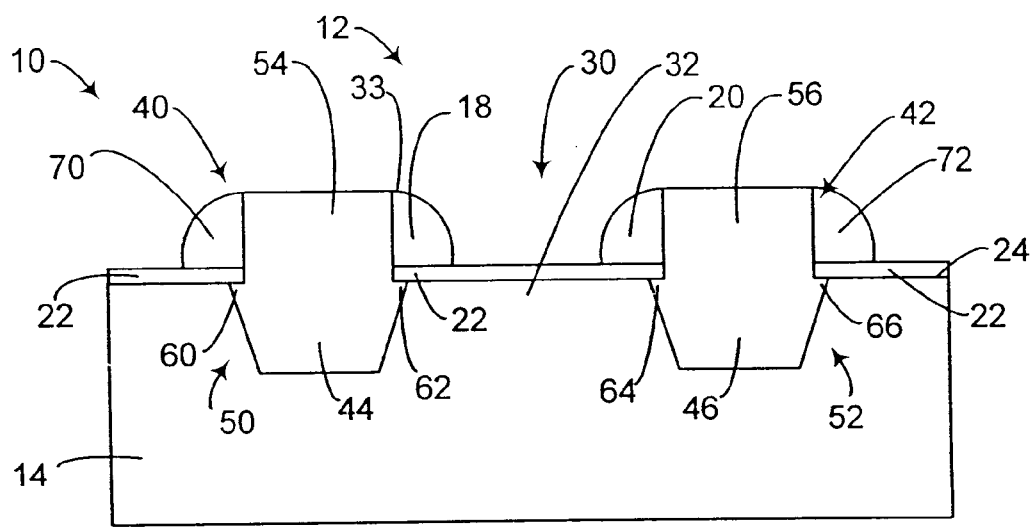

A portion of the semiconductor material 126 is then removed, as shown in FIG. 10, to form the discrete floating gates 18, 20, 70, and 72. The removal may be by accomplished by suitable methods, such as by anisotropic etching. The removal allows discrete floating gates 18, 20, 70, and 72 to be formed, for example removing the semiconductor material 126 from the tops of the insulators 40 and 42, and from the gap 30 between the floating gates 18 and 20.

Figure 11:
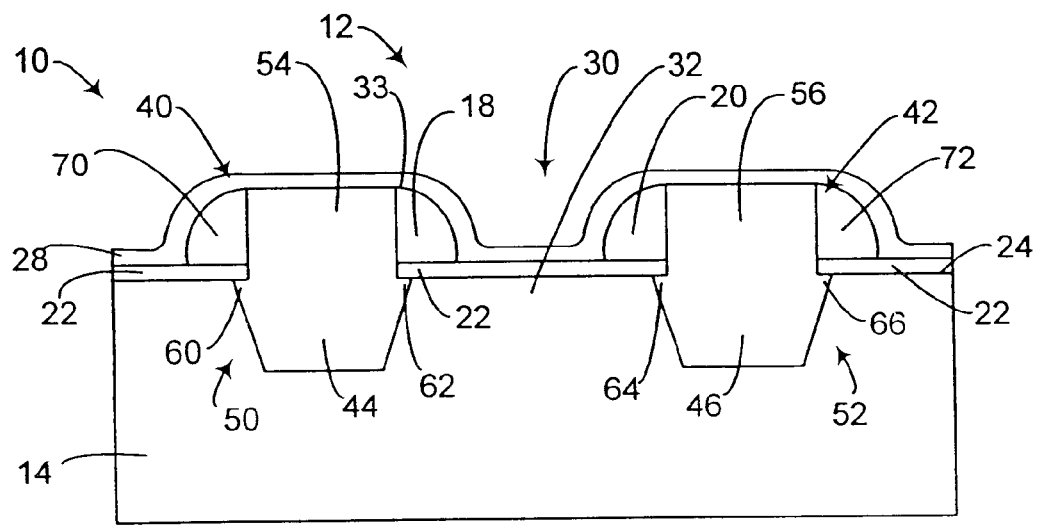

FIG. 11 illustrates formation of the interpoly dielectric 28. Discussing the formation of the interpoly dielectric 28 in some detail, the bottom oxide layer 28c may be formed by a deposition process, such as a rapid thermal chemical vapor deposition (RTCVD) process. Alternatively, the bottom oxide layer 28c may be formed by depositing the oxide in a batch furnace by an LPCVD process. The bottom oxide layer 28c may have a thickness in the range from about 10 to about 150 angstroms, and may have a thickness in the range from about 20 to about 100 angstroms.

The middle dielectric layer 28b is then formed on the bottom oxide layer 28c. As stated above, the middle dielectric layer 28b may include a high-K dielectric material. In one embodiment, the middle dielectric layer 28b includes both a high-K dielectric material and a standard-K dielectric material. In another embodiment, the middle dielectric layer 28b includes a composite dielectric material, which includes a composite or a reaction product of two or more dielectric materials, at least one of which is a high-K dielectric material. The composite dielectric material may include a mid-K dielectric material that is a composite of a high-K dielectric material and a standard-K dielectric material. Thus, in one embodiment, the high-K dielectric material completely replaces the nitride layer of a conventional ONO structure. In another embodiment, the high-K dielectric material is, in essence, added to or combined with, the nitride layer of a conventional ONO structure. In another embodiment, the middle dielectric layer 28b includes a composite dielectric material which replaces the nitride layer of a conventional ONO structure.

In still another embodiment, the high-K dielectric material layer is sandwiched between two nitride layers, the lower of which is deposited on the bottom oxide layer 28c. In another embodiment, a nitride layer is deposited on the bottom oxide layer 28c followed by deposition of a high-K dielectric material layer on the nitride layer. In yet another embodiment, the nitride layer is deposited on a high-K dielectric material layer which has been formed on the bottom oxide layer 28c. In another embodiment, alternating sub-layers of nitride and high-K dielectric material are deposited on the first bottom oxide layer 28c.

The middle dielectric layer 28b may be formed by a RTCVD process. The RTCVD process may be carried out at a temperature of about 400° C. to about 800° C. High-K dielectric material may be formed by reacting a suitable metal-containing gas, e.g., hafnium tetra-t-butoxide with a suitable oxygen-containing gas, e.g., oxygen ($O_2$) or nitrous oxide ($N_2O$). It will be appreciated that other suitable CVD processes may be utilized.

In another example process, a silicon containing gas, such as $SiH_4$, may be provided together with or alternating with the high-K precursor vapor, during the step of forming the high-K dielectric material sub-layers, in an embodiment in which a composite dielectric material comprising both a high-K dielectric material and a standard-K dielectric material is to be produced. In one embodiment, a nitrogen-containing gas, such as ammonia ($NH_3$) may be provided along with the silicon-containing gas, oxygen-containing gas and high-K precursor.

It will be appreciated that alternatively the middle dielectric layer 28b may be a nitride layer that does not contain a high-K dielectric material.

The top oxide layer 28a is formed on middle dielectric layer 28b. The top oxide layer 28a may be formed using methods discussed above with regard to formation of the bottom oxide layer 28c. If the middle dielectric layer 28b includes a high-K dielectric material, it may be desirable to form the top oxide 28a on the middle dielectric layer 28b, without exposing the middle dielectric layer 28b to ambient atmosphere.

Following formation of the interpoly dielectric 34, other steps may be performed to form the device shown in FIGS. 1 and 2, and described above. The control gate 26, as well as other control gates of the memory device 10, may be formed by depositing a layer of suitable conductive material, such as polysilicon, and selectively removing parts of the conductive material, such as by etching, form the control gates. Other steps in the formation of the memory device 10 may then be performed, such as doping to form the source 34 and the drain 35. Various steps may also be undertaken to form suitable electrical connections to the parts of the cells of the memory device 10.

The memory device described above may be any of a large variety of types of non-volatile memory devices.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A non-volatile memory device comprising:
    a semiconductor substrate, wherein the substrate has a pair of trenches therein, and wherein the substrate has a source and a drain therein;
    a tunnel oxide on a top substrate surface of the substrate;
    a pair of insulators;
    a pair of floating gates over the tunnel oxide and between the insulators, wherein the pair of floating gates are not directly electrically coupled to each other, wherein the floating gates are each operatively coupled to the source and the drain, and wherein the floating gates have a gap therebetween;
    an interpoly dielectric over the floating gate, wherein the interpoly dielectric is in contact with the floating gate; and
    a control gate over the interpoly dielectric, wherein the control gate is in contact with the interpoly dielectric;
    wherein a channel gate portion of the control gate is located in the gap between the floating gates.

2. The device of claim 1, wherein the insulators have respective lower trench-fill portions in respective of the trenches, wherein the insulators have respective upper protruding portions protruding from the top substrate surface, and wherein the upper protruding portions have respective top insulator surfaces.

3. The device of claim 2, wherein the floating gates are in contact with respective of the upper protruding portions of the insulators.

4. The device of claim 2, wherein the floating gates have substantially the same height above the substrate as the upper protruding portions.

5. The device of claim 2, wherein the upper protruding portions protrude above the substrate farther than the floating gates.

6. The device of claim 1, wherein the floating gates each have a curved upper surface.

7. The device of claim 1,
    wherein the control gate is configured such that a channel in the substrate, underneath the channel gate portion of the control gate, becomes conductive when 1) there is no charge stored on the floating gates, and 2) a sufficiently high threshold voltage is provided on the control gate; and
    wherein the floating gates are configured such that, when a sufficient charge is stored on the floating gates, the threshold voltage is increased to an increased threshold voltage.

8. The device of claim 1, wherein the interpoly dielectric includes upper and lower oxide layers, with a nitride layer therebetween.

9. The device of claim 1, wherein the interpoly dielectric includes upper and lower layers, with a middle layer therebetween.

10. The device of claim 9, wherein the middle layer includes a high-K dielectric.

11. The device of claim 10, wherein the upper and lower layers both include an oxide.

12. The device of claim 10, wherein the middle layer also includes a nitride.

13. The device of claim 10, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

14. The device of claim 10, wherein the high-K dielectric material includes aluminum nitride.

15. The device of claim 9, wherein the middle layer includes a composite dielectric material including a high-K dielectric material and at least one additional dielectric material.

16. The device of claim 1, wherein the floating gate is phosphorous-doped polysilicon.

17. The device of claim 2, wherein the floating gate overlaps corner parts of the lower trench-fill portions of the insulators.

18. The device of claim 2, wherein the protruding portions protrude from the top substrate surface from between 1000 and 4000 angstroms.

19. The device of claim 1, wherein the floating gates are in contact with the tunnel oxide.

20. The device of claim 1,
    wherein the pair of insulators are part of a plurality of insulators; and
    wherein the pair of insulators are adjacent to one another, without other insulators therebetween.

21. A non-volatile memory device comprising:
    a semiconductor substrate, wherein the substrate has a pair of trenches therein, and wherein the substrate has a source and a drain therein;
    a tunnel oxide on a top substrate surface of the substrate;
    a pair of insulators;
    a pair of floating gates over the tunnel oxide and between the insulators, wherein the pair of floating gates are not directly electrically coupled to each other, wherein the floating gates are each operatively coupled to the source and the drain, and wherein the floating gates have a gap therebetween;
    an interpoly dielectric over the floating gate, wherein the interpoly dielectric is in contact with the floating gate; and
    a control gate over the interpoly dielectric, wherein the control gate is in contact with the interpoly dielectric;
    wherein a channel gate portion of the control gate is located in the gap between the floating gates;
    wherein the insulators have respective lower trench-fill portions in respective of the trenches, wherein the insulators have respective upper protruding portions protruding from the top substrate surface, and wherein the upper protruding portions have respective top insulator surfaces;
    wherein the floating gates are in contact with respective of the upper protruding portions of the insulators
    wherein the control gate is configured such that a channel in the substrate, underneath the channel gate portion of the control gate, becomes conductive when 1) there is no charge stored on the floating gates, and 2) a sufficiently high threshold voltage is provided on the control gate; and
    wherein the floating gates are configured such that, when a sufficient charge is stored on the floating gates, the threshold voltage is increased to an increased threshold voltage.

22. A method of making a non-volatile memory device, comprising:
- forming a pair of insulators on a substrate, the insulators each having an upper protruding portion that protrudes from a top substrate surface of the substrate;
- forming a pair of floating gates between the upper protruding portions, wherein the pair of floating gates are not directly electrically coupled to each other, wherein the floating gates are in contact with respective of the upper protruding portions, and wherein the floating gates have a gap therebetween;
- forming an interpoly dielectric on the floating gates and the upper protruding portions; and
- forming a control gate on the interpoly dielectric, wherein a channel gate portion is in the gap between the floating gates.

* * * * *